United States Patent [19]
Kamio et al.

[11] Patent Number: 5,126,114
[45] Date of Patent: Jun. 30, 1992

[54] MANUFACTURING METHOD AND EQUIPMENT OF SINGLE SILICON CRYSTAL

[75] Inventors: Hiroshi Kamio, Tokyo; Kenji Araki; Yoshinobu Shima, both of Yokohama; Makoto Suzuki; Akira Kazama, both of Kawasaki; Shigetake Horie, Tokyo; Yasumitsu Nakahama, Yokohama, all of Japan

[73] Assignee: NKK Corporation, Tokyo, Japan

[21] Appl. No.: 460,563

[22] Filed: Jan. 3, 1990

Related U.S. Application Data

[63] Continuation-in-part of Ser. No. 281,191, Dec. 7, 1988, abandoned.

[30] Foreign Application Priority Data

Dec. 8, 1987 [JP] Japan .................. 62-308766

[51] Int. Cl.$^5$ ............................................. C30B 15/12
[52] U.S. Cl. ...................................... 422/249; 156/617.1; 156/618.1; 156/620.4
[58] Field of Search ............ 156/617.1, 618.1, 620.4, 156/DIG. 115; 422/249

[56] References Cited

U.S. PATENT DOCUMENTS

| | | | |
|---|---|---|---|
| 3,265,469 | 8/1966 | Hall | 156/DIG. 115 |
| 3,582,287 | 6/1971 | Capita | 156/DIG. 115 |
| 4,036,595 | 7/1977 | Lorenzini et al. | 156/DIG. 115 |
| 4,330,361 | 5/1982 | Kuhat-Kuhnenfeld et al. | 156/626.4 |
| 4,330,362 | 5/1982 | Zulehner | 422/249 |
| 4,436,577 | 3/1984 | Frederick et al. | 156/620.4 |
| 4,659,421 | 4/1987 | Jewett | 422/249 |
| 4,911,895 | 3/1990 | Kida et al. | 156/DIG. 115 |

FOREIGN PATENT DOCUMENTS

| | | | |
|---|---|---|---|
| 0069821 | 1/1983 | European Pat. Off. | 422/249 |
| 0170856 | 2/1986 | European Pat. Off. | 422/249 |
| 2245250 | 3/1974 | Fed. Rep. of Germany | 156/617.1 |
| 1-5992 | 1/1989 | Japan | 156/620.4 |
| 1-122988 | 5/1989 | Japan | 156/617.1 |
| 1-234388 | 9/1989 | Japan | 156/620.4 |
| 8603523 | 6/1986 | PCT Int'l Appl. | 156/620.4 |
| 632300 | 9/1982 | Switzerland | 422/249 |

*Primary Examiner*—Robert Kunemund
*Attorney, Agent, or Firm*—Michael N. Meller

[57] ABSTRACT

According to the present invention, the inside of a crucible in which a molten raw material is placed is partitioned off with a partition ring so that a pulled single crystal is surrounded and the molten raw material may be moved and granular silicon is supplied to the outside of the partition ring, thereby to form the whole surface of outside molten liquid as a granular silicon soluble region so as to maintain the molten liquid surface on the inside of the partition ring at almost a constant level, and also to set the temperature of the molten liquid on the outside of the partition ring higher than the temperature of the inside thereof at least by 10° C. or higher by covering the partition ring and the molten liquid surface on the outside thereof with a heat keeping board.

12 Claims, 8 Drawing Sheets

MANUFACTURING METHOD AND EQUIPMENT OF SINGLE SILICON CRYSTAL

This is a continuation-in-part of U.S. Ser. No. 281,191, filed Dec. 7, 1988, now abandoned.

BACKGROUND OF THE INVENTION

The present invention relates to a manufacturing method and apparatus for making a single silicon crystal of large diameter by the Czochralski method (hereafter call the CZ method)

A manufacturing method of a single silicon crystal by the CZ method has been heretofore performed and is recognized as an almost perfect technique.

The diameter of a crystal required in the LSI industry has been increasing year by year. Nowadays, a 6-inch crystal is used for the most advanced LSI chip. It is anticipated that, in the near future, a crystal with a 10-inch or larger diameter, e.g. 12 inches, will be required.

As is generally known, according to this technique, when a molten silicon raw material is placed in a crucible made of quartz and a seed crystal is pulled gradually while said seed crystal contacts this molten surface, crystal growth is performed along with solidification of the contacted surface, thus providing a columnar single silicon crystal.

There are two concepts for crystal growing by the CZ process: use of a rotating crucible or a non-rotating crucible. Today all CZ silicon crystals for use in semiconductors is manufactured by the conventional CZ process where crucible is rotated in the direction opposite to that of the crystal and the silicon pool is heated mainly by an electric resistance side heater which surrounds the side wall of the crucible A silicon single crystal with a diameter larger than 5 inches has never been produced by the process where the crucible was not rotated or was heated by methods other than that mentioned above, though many attempts have been made to do so. This is due to the fact that temperature distribution which is perfectly concentric to the growing crystal has not been obtained without crucible rotation and by other heating methods such as an induction heater surrounding the crucible and an electric resistance heater placed under the crucible It is important to note that crystal growing of this type is very sensitive to temperature.

In the conventional CZ process, the combination of a rotating crucible and an electric resistance side heater surrounding the crucible forces molten silicon liquid to by agitated strongly by convection. Accordingly, a temperature distribution which is uniform and perfectly concentric to the silicon crystal is obtained on the molten silicon surface, which is suitable for large diameter crystal growth. Therefore, the present invention is based on the conventional CZ process.

There is a big difference in liquid flow between the conventional CZ process and the other CZ process. This difference results in a big difference in conditions for crystal growing. The concept for crystal growing and the conditions involved therein had to be changed completely. The actions and structure of parts in the furnace also differed very much.

In this case, in order to make the single silicon crystal a P-type or N-type semiconductor according to the object, a proper quantity of doping material such as boron, antimony and phosphorus is mixed in the molten raw material. However, the way of introducing these doping materials into the single silicon crystal is not fixed, and the concentration gets higher toward the lower part.

Furthermore, impurities such as oxygen and carbon that are mixed inevitably in production have a big effect in addition to doping materials that are intentionally mixed in the single silicon crystal as described above. That is, it is possible to improve the characteristic and the yield of a semiconductor by oxygen taken into the single silicon crystal. Therefore, it is desirable that oxygen is contained uniformly from the upper part to the lower part of the single silicon crystal, but the upper part has a higher concentration in general. Thus, the single silicon crystal is manufactured with the upper part of single silicon crystal having a low doping material concentration and a high oxygen concentration as the reference.

However, as the pulling of the single silicon crystal proceeds, the liquid surface of the molten raw material in the crucible is lowered, and the temperature of the molten liquid surface is changed. Therefore, the concentration of doping material is elevated and the concentration of oxygen is lowered in the molten raw material in the crucible. Accordingly, the doping material existing in the single silicon crystal which is made to grow by pulling is increased gradually and oxygen is reduced, thereby causing the quality of manufactured single silicon crystal to fluctuate along the pulling direction.

Due to such variation of doping material and oxygen, the yield of usable wafers sometimes becomes as low as 50% or less in the case of a strict specification of components.

As an effective method of solving such a problem, a method is well known, where the liquid surface of molten raw materials is kept constant, resulting from the continuous feed of the silicon raw materials to the crucible. Some inventions about the method of pulling the single silicon crystal have been disclosed, for instance, in Laid-Open Patent Publication Nos. 84397/81, 88896/81, 164097/81, 36997/83, 130195/83, 241889/87 and 36197/86, and Laid-Open Utility Model Publication No. 141578/84. A brief discussion of these references follows.

In Laid-Open Publication Nos. 84397/81, 88896/81 and 164097/81, the crucible is not rotated. Moreover, induction heating is applied in 88096/81 and 164097/81. In 84397/81, the heating method is not disclosed. The method of using an electric resistance side heater surrounding crucible is not applicable to this method. In these methods, a silicon single crystal with a large diameter cannot be produced No. 36997/83 is concerned with oxide materials, and not silicon. Therefore, the crystal diameter required is small and the crucible is made of a noble metal with a high melting temperature. Therefore, induction heating, which is simple, is used in this case. A large diameter silicon crystal has never been produced by induction heating as mentioned above. This patent therefore does not meet the requirements of the present invention.

In No. 36197/86 and Utility Model No. 141578/84, an electric resistance heater is placed under the crucible in addition to side heater and is used as a main heater (In No. 141578/84, it is supposed to be used primarily. This is unfavorable for large diameter crystal growth. These two inventions are therefore unacceptable as crystal growing methods for use in LSI.

Moreover, in No. 36197/86, large heat radiation loss from partition results in the occurrence of solidification on the side wall of the partition in crystal growing area, as pointed out in No. 241889/87 (Page 2 line 12 to line 16, i.e., problems to be solved by this invention). Once the solidification starts, solidified silicon grows toward the crystal until touching it, thus interrupting the crystal growing operation. There are additional faults in this referenced invention. The holes in the dam (partition) which connect the raw materials melting area and the crystal pulling area are designed to be so large that the liquid silicon in both areas can flow in both directions, that is, from the outside to the inside and vice versa. Therefore, the liquid temperature outside the partition is decreased and the raw materials may not be molten in sufficient quantity for large diameter crystal growth, even though the heat insulating cover is disposed above the liquid outside the partition.

In Utility Model No. 141578/84, there exists the same problems as in the case of No. 36197/86, but the situation appears to be worse than in No. 36197/86.

No. 130195/83 and No. 241889/87 are based on the conventional CZ process. However, these prior art methods are suitable for large diameter crystal growth only conceptually.

No. 130195/83 does not solve the solidification problem on the partition wall which No. 36197/86 and Utility Model No. 141578/84 suffer from. Furthermore, this prior art invention cannot melt the raw materials at a rate which is required in a continuous charge CZ process for a large diameter crystal. The reasons are as follows: the feeding pipe of raw materials is immersed in the liquid silicon. Thus, the melting zone of raw materials is restricted within the narrow feeding pipe. As the raw materials cannot melt instantaneously, they are accumulated in the feeding pipe in the solid state.

No. 241889/87 may solve the solidification problem on the partition wall because there is no partition in the crucible according to this invention. But this prior art invention suffers from a huge problem concerned with the melting of raw materials. That is, the melting zone of raw materials is restricted to a narrow region as in the case of No. 130195/83. Therefore, this invention also cannot melt the raw materials at a rate which is required in a continuous charge CZ process. In addition, very expensive reformation of quartz crucible is required, which causes an increase in the production cost of a single crystal.

Recently, it has become possible to manufacture high quality granular polycrystalline silicon, and it is considered comparatively easy to feed such granular silicon to a molten raw material continuously and fixed quantity as disclosed in Provisional Publication No. 172289/83. However, when granular silicon is dropped on the liquid surface of the molten raw material, solidification is commenced with this granular silicon as a starting point. Therefore, it is impossible theoretically to grow a single silicon crystal by supplying granular silicon continuously by this method. The reason why solidification is commenced at dropped granular silicon is:

(a) the liquid temperature at the time of pulling a single silicon crystal is right above the melting point as apparent from the principle thereof,
(b) since the specific gravity of silicon is lighter in a solid form than in a liquid form, granular silicon floats on the liquid surface, and
(c) the emissivity of silicon is higher in a solid form than in a liquid form.

That is, granular silicon floats on the molten silicon liquid surface right above the solidifying point and heat is radiated quickly therefrom as the radiant heat, thus developing solidification around the floating granular silicon. Furthermore, a wave pattern generated when granular silicon is dropped also causes a problem.

On the other hand, there are inventions in the oxide semiconductor field such as those disclosed in Provisional Publication No. 88896/81 and Provisional Publication No. 36997/83. According to these inventions, since the diameter of a pulled crystal is small, a small sized double crucible may be used, thereby to heat a double crucible directly by induction heating, and thus, solidification of the molten liquid between crucible can be prevented. However, in case of a single silicon crystal, the pulled single crystal has a large diameter and is expensive, and contamination is also caused. Therefore, a metallic crucible cannot be used, but a high quality quartz crucible is usually used Accordingly, the induction heating system cannot be employed.

Also, according to the invention disclosed in Provisional Publication No. 130195/83, a quartz crucible having a double construction is used, and it looks at first sight that there is no problem against solidification of molten raw material portion. However, as pointed out in a publication described later (Provisional Publication No. 241889/87, page 2, line 12 to line 16 of "Problems to Be Solved by the Invention"), the problem of solidification starting from the contact portion of the inside crucible with the molten liquid surface has not been solved as yet. Moreover, it is conjectured that the area where the molten liquid on the outside of the inside crucible comes in contact with the outside crucible reaches close to 90% of the area where the whole molten liquid comes in contact with the outside crucible in the crucible of a double construction according to the present invention, and majority of the heat from the heater enters directly into the molten liquid on the outside of the inside crucible. Accordingly, it is difficult to raise the temperature in the inside crucible when a single silicon crystal having a large diameter is pulled. In order to raise the temperature compulsorily to a crystal upbringing temperature, and to prevent abovementioned solidification starting from the contact portion of the inside crucible with the molten liquid surface, extensive quantity of heat, viz., heater electric power is required, which is not practical. Furthermore, in this invention, since a feeding pipe of silicon raw material is inserted between the inside crucible and the outside crucible, the silicon raw material is fed as the result, through a feeding pipe immersed in the molten liquid on the outside of the inside crucible. However, the silicon raw material is not molten instantaneously on the molten liquid surface with such a feeding method. Therefore, the silicon raw material reaches a high temperature, but is accumulated in the feeding pipe as it is a solid body. When accumulation once occurs, a sintered state is produced between raw materials and between the raw material and the inner wall of the feeding pipe, and it becomes impossible to supply the raw material thereafter. Because of such reasons, this invention has not been put to practical use as yet.

There are those inventions disclosed in Utility Model Provisional Publication No. 141578/84 and Provisional Publication No. 241889/87 as similar inventions to above-mentioned invention (Provisional Publication No. 130195/83). In the former invention (Utility Model Provisional Publication No. 141578/84), a ring body is floated on the molten liquid. However, according to this equipment, there is a convention of a molten liquid between the single silicon crystal pulling portion and the granular raw material feeding portion, and the temperature on the outside of the floating ring reaches right above the melting point which is almost equal to that of the single silicon crystal pulling portion theoretically. Therefore, the basic problem of progress of solidification from granular silicon floating on the liquid surface has not been solved at all. Moreover, the problem of progress of solidification starting from the floating ring pointed out in the latter specification (Provisional Publication No. 241889/87, page 2, line 12 to line 16 in "Problems to Be Solved by the Invention") is not solved, but only the problem of the wave pattern has been solved.

On the other hand, in the latter invention (Provisional Publication No. 241889/87), there is provided along the outside surface of the crucible a vertical through for feeding the silicon raw material into the crucible via a through hole provided on the crucible. However, the capacity of the raw material melting portion of the vertical through is small. Therefore, when the silicon raw material having a very large fusing latest heat is supplied continuously, the raw material cannot be molten completely. Also, the through hole being near to the molten silicon level, the molten liquid having different density moves straight to the single crystal interface with the convection, thus concentration fluctuation is easily produced and crystal growth with high quality is hindered. In addition, with this invention, very expensive processing of a quartz crucible is required, which causes increase in cost.

Also, according to the invention disclosed in Provisional Publication No. 36197/86 heat insulation cover is disposed above the molten liquid surface on the outside of the partition (dam) so as to melt granular raw material rapidly. With this invention, however, as pointed out in above-described Provisional Publication No. 241889/87, heat radiation from the partition can neither be controlled, and the problem of generating solidification from the contact portion of the partition with the molten liquid surface has not been solved as yet.

When a single silicon crystal is pulled while feeding granular silicon into the crucible continuously and directly on the basis of above-mentioned convention technique, there are such problems as follows.

(1) While pulling a single silicon crystal, the molten liquid temperature is fairly close to the melting point of silicon, but if granular silicon at a temperature close to the room temperature is fed continuously under such condition, granular silicon is not molten completely, but floats on the molten liquid surface as it is solid state, and the molten liquid is solidified and grown with the solid as a core.

(2) When the melting portion and the single crystal pulling portion of granular silicon are partitioned off each other, solidification is liable to be generated from this partitioning portion because of the fin effect so called in electric heating and the higher emissivity than the molten silicon liquid, and if solidification is generated once, the growth thereof is continued and upbringing of a sound single silicon crystal is impeded.

(3) When granular silicon is fed into a crucible for single crystal pulling by dropping continuously, a wave pattern is generated at the drop portion on the molten liquid surface, and the wave reaches the single silicon crystal pulling portion, thus impeding upbringing of a sound single silicon crystal.

SUMMARY OF THE INVENTION

It is an object of the present invention which has been made to solve above-mentioned problems to provide a method and a equipment which is able to dissolve surely the charged granular and small lump-shaped silicon raw material without impeding upbringing of a single silicon crystal and to manufacture a single silicon crystal having almost constant doping material concentration and oxygen concentration in the pulling direction in a single silicon crystal pulling method, in which granular or small lump-shaped raw material is fed into the crucible containing the molten raw material.

The present invention has been made to achieve the object by solving above-mentioned problems and provides, (1) a manufacturing method of a single silicon crystal for manufacturing a columnar single silicon crystal by pulling a molten raw material placed in a crucible, wherein: the inside of said crucible is partitioned off so that said pulled single silicon crystal is surrounded and said molten raw material may be moved; the molten liquid surface on the inside of said partition is maintained almost at a constant level with the whole molten liquid surface on the outside of said partition as granular silicon soluble area by feeding granular silicon to the molten liquid surface on the outside of said partition; said partition and the molten liquid surface on the outside of said partition are covered with a heat reserving board; and the temperature of the molten liquid on the outside of said partition is set higher than the temperature of the inside molten liquid at least by 10° C. or higher, and provides further for executing the above-mentioned method, (2) a manufacturing equipment of a single silicon crystal comprising: a partition ring provided with small holes penetrated therethrough and immersed in said crucible so as to surround said pulled single silicon crystal; a heat keeping board disposed so as to cover said partition ring and the molten raw material on the outside of the partition ring; and a granular silicon feeding device disposed on the molten raw material on the outside of said partition ring, (3) according to above-mentioned equipment, a manufacturing equipment of a single silicon crystal, wherein a graphite crucible is partitioned off with heat resisting material of low thermal conductivity at locations corresponding to the partition rings, and heat insulting blocks are disposed underneath said graphite crucible, (4) according to equipment in (2), a manufacturing equipment of a single silicon crystal, wherein a heating body is disposed close to the molten liquid surface on the outside of said partition ring.

Simultaneously with pulling of a single silicon crystal, granular silicon is fed from a raw material feeder to the molten liquid surface on the outside of the partition ring. In this case, a wave pattern generated at the time of dropping the granular silicon is prevented from propagating inward by means of the partition ring. On the other hand, the outside of the partition ring is covered with a heat insulating board so as to be kept at a higher temperature than the inside. Thus, the fed granular silicon is molten and moves inward through a small hole in the partition ring, the liquid surface of the inside molten raw material is kept at a fixed level and a single silicon crystal having a uniform quality in the pulling direction is obtainable.

Besides, in the invention described in and after item 3, the temperature of the molten liquid on the inside and the outside of the partition ring is controlled at a desired value, and the temperature of the outside molten liquid surface is maintained at a temperature higher than the inside temperature by at least 10° C. or higher.

In other words, present invention provides a method and an apparatus for manufacturing a single silicon crystal wherein the problem of solidification of molten liquid on the partition wall has been solved.

The basic concept of the present invention is as follows:

a) The process is based on the conventional CZ process, wherein
  i. the crystal and crucible are rotated, and
  ii. the crucible is heated mainly by an electric resistance side heater which surrounds the crucible.
b) The crucible is separated into two areas, a crystal growing area and a raw materials melting area, by a cylindrical partition made of fused quartz.

The problems which arise in the course of crystal growing under the above-mentioned concept are as follows:

a) The generation of solidification at liquid surface on the partition wall facing crystal pulling area (as pointed out in No. 241889/87, page 2, lines 12-16). If the solidification is once generated, the growth continues until the whole surface in the crystal growing area solidifies.
b) Incomplete melting of raw materials. Countermeasures for the above problems.

(a) For the solidification

The reasons of the solidification is supposed as follows (refer to FIG. 9). The partition made of quartz conducts heat very well, as presumed from the fact that quartz is applied to optical fiber. Heat in liquid is conducted upwards by the partition as heat is a kind of light and radiated from the part of partition exposed above the liquid surface. As shown in FIG. 9, this leads to decrease in liquid temperature adjacent to the partition. Additionally, the surface temperature of liquid in crystal growing area is uniform and just above the solidification temperature, which is essential condition for large diameter crystal growth. This temperature condition accelerates the solidification. The countermeasure for the solidification is restraint of heat radiation from the partition. This is performed by covering the partition by heat keeping material.

(b) For incomplete melting of raw material:

The temperature of liquid between the partition and the crucible wall has to be kept so high that raw materials melt quickly. The liquid temperature in raw materials melting area should be higher than in crystal pulling area by 10° C. This is performed by next two measures. The first is restraint of heat radiation from the liquid surface in raw materials melting area. This is performed by equipping over the surface of the melting area with a heat insulating material. The second is to prevent the liquid in crystal pulling area from flowing back into the raw materials melting area.

The flow of liquid should be in one way traffic, from the raw materials area to the crystal pulling area. It is unfavorable that the liquid in the crystal pulling area of which temperature is close to solidification temperature flows into the raw materials area. In order to maintain this condition, the opening between both areas should be narrow. The partition should be stuck to the bottom of crucible The holes which conduct liquid from outside to inside of the partition should be as small as possible.

Figure 1:
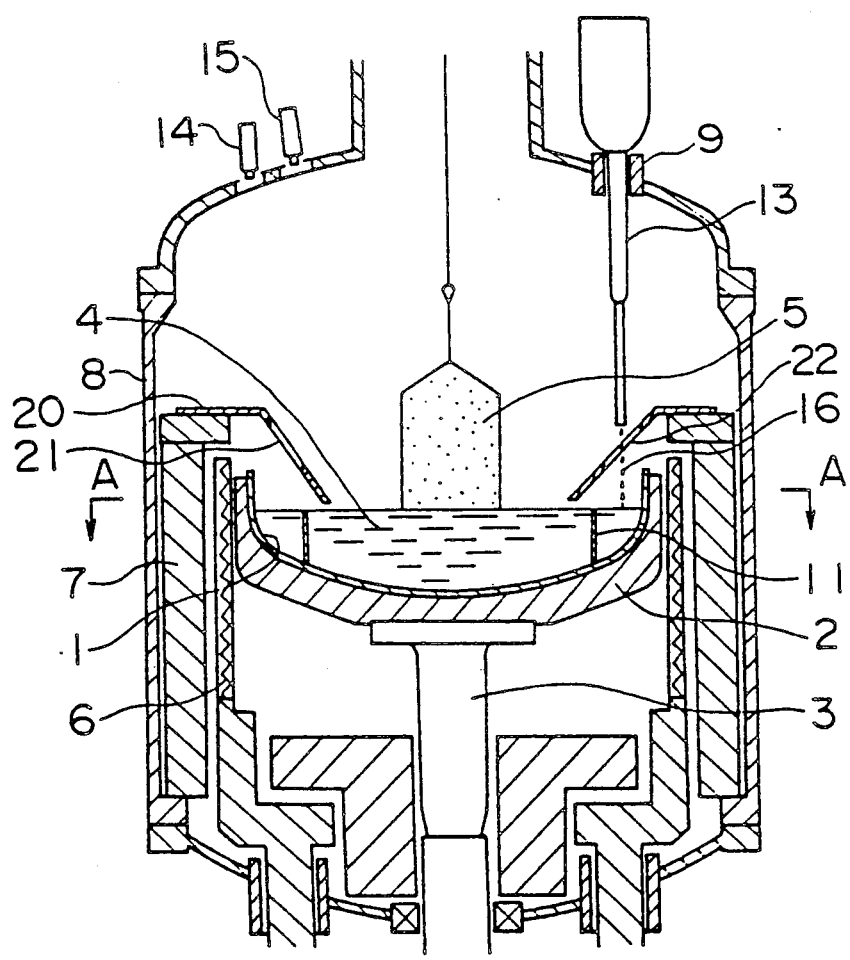
FIG. 1 is a longitudinal cross-sectional view showing a typical embodiment according to the present invention.

In the drawings, reference numerals are denoted as follows: 1 . . . crucible; 2 . . . graphite crucible; 4 . . . molten raw material; 5 . . . single silicon crystal; 6 . . . heater; 8 . . . chamber; 11 . . . partition ring; 12 . . . small hole; 13 . . . raw material feeder; 14, 15 . . . temperature detectors; 16 . . . granular silicon; 17 . . . heat resisting material; 18 . . . heat insulating block; 20 . . . heat keeping board; 23 . . . auxiliary heater; 24, induction coil.

Figure 2:
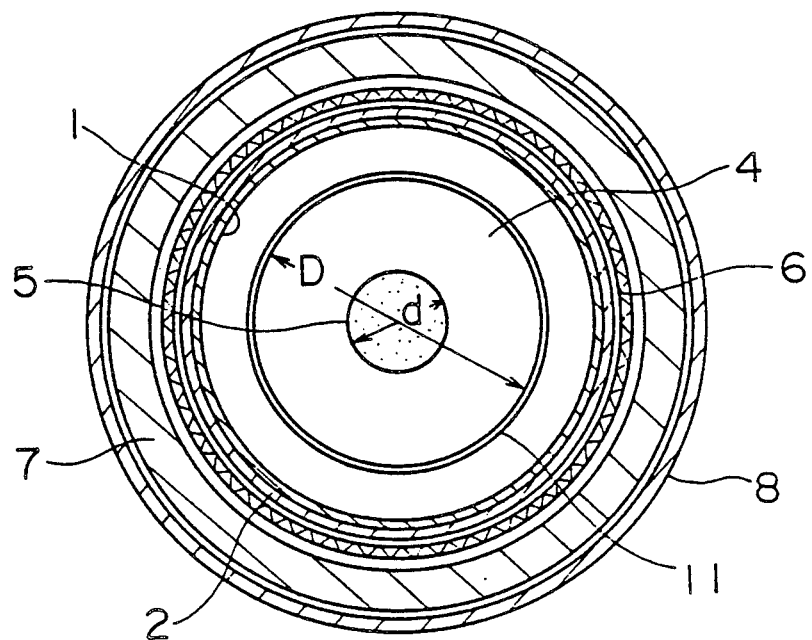
FIG. 2 is a cross-sectional view thereof taken along the Line A—A.

FIG. 1 is a cross-sectional view showing a typical embodiment according to the present invention, and FIG. 2 is a cross sectional view thereof taken along the line A—A. In these Figures, the reference numeral 1 denotes a quartz crucible and is set in a graphite crucible 2. The graphite crucible 2 is supported movably up and down and rotatably on a pedestal 3. The reference numeral 4 represents molten raw materials of silicon placed in the crucible 1, from which a single silicon crystal 5 which is upbrought in a columnar form of a diameter between 12 Cm-30 Cm is pulled. 6 denotes a heater surrounding the graphite crucible 2, 7 denotes a hot zone heat insulating material surrounding this heater 6, and these are contained in a chamber 8. Such a structure is basically the same as a single silicon crystal pulling equipment by the conventional Czochralski method.

Figure 3:
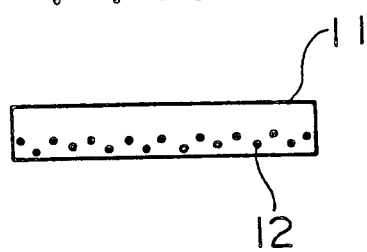
FIG. 3 is a side view showing an embodiment of a partition ring.

The reference numeral 11 denotes a partition ring composed of fused quartz of high purity and disposed concentrically with the crucible 1. A plurality of small holes 12 are disposed penetrating through an area below the nearly central portion in the height direction (FIG. 3).

In the case of this figure, the number of holes is 34. A larger number of holes may contribute to more stable crystal growth, as molten silicon from the raw materials melting area is mixed better with molten silicon in the crystal pulling area. However, as it is troublesome to make many holes; practically, the maximum number is 34 in this instance.

This partition ring 11 is set in the crucible 1 together with the silicon raw materials when it is charged and disposed in the molten liquid 4 so as to surround the single silicon crystal 5 after the raw material is molten, and the upper edge portion thereof is exposed slightly above the molten liquid surface. Also, the lower edge portion presents a state of almost fusing and sticking to the crucible 1, and does not float off. Therefore, the outside and the inside of the partition ring 11 may be partitioned off completely. Accordingly, the molten liquid outside the partition ring can move quietly inward only through the small holes 12. This is one of the important requirements for getting temperature difference between the outside and the inside of the partition to greater than 10° C. If there are comings and goings of liquid between the outside and the inside, which results from too large opening between both areas, accomplishment of the temperature difference becomes more difficult.

The reference numeral 9 is an opening portion provided on the chamber 8 corresponding to the molten liquid surface outside the partition ring 11. To this opening portion 9 is inserted and fixed a feeder 13 for small chunk or granule of silicon (hereinafter referred to just as granular silicon), and the exit of the feeder 13 is opposed to the molten liquid surface outside the partition ring 11. This feeder 13 is coupled with a raw materials feeding chamber (not shown) provided outside the chamber 8, and feeds granular raw materials continuously.

Reference numerals 14 and 15 denote temperature detectors such as a radiation thermometer disposed in the upper part of the chamber 8. One temperature detector 14 measures the temperature of the molten liquid surface outside the partition ring 11 and the other temperature detector 15 measures the temperature of the molten liquid surface of the inside thereof, respectively.

The reference numeral 20 denotes a heat keeping board which consists of a flange portion 20a and a funnel-shaped shielding portion 20b. The board 20 is made of graphite plate of which underside or whole surface is covered with a quartz plate having a thickness of 1 mm, or a plate material prevented from contamination by coating the surface thereof with SiC and Si$_3$N$_4$ of high purity. The flange portion 20a is supported by a hot zone heat insulating material 7 and is set so as to cover the partition ring 11 and the wall surface of the crucible 1. This heat keeping board 20 prevents the molten liquid from solidification which generates from a part of the partition ring 11 exposed from the molten liquid surface and grows inwards, i.e. into crystal pulling area 4. For this purpose, the bottom portion (inner peripheral portion) thereof should be disposed close to the molten liquid surface (approximately 10 mm in the embodiment). The reference numeral 21 represents a hole provided correspondingly to the visual field of the temperature detector 14, and 22 represents a hole provided on the feeding path of granular silicon 16.

In the present invention thus constructed, the molten raw molten raw materials 4 is placed inside and outside the partition ring 11 immersed in the crucible 1, and both molten surfaces are maintained on the same level. When the seed crystal is pulled gradually while rotating after the contact with the inside molten liquid surface, the columnar single silicon crystal 5 is obtained. In the interim, granular silicon 16 is fed onto the molten surface outside the partition ring 11 and this granular silicon 16 is made molten by the molten liquid outside the partition ring 11 and moves inwards through small holes 12 of the partition ring 11, thus maintaining the liquid surface level of the molten raw materials 4 always constant Besides, the reason why the lower end portion of the raw materials feeder 13 is positioned above the molten liquid surface so that granular silicon drops onto the molten liquid surface is that granular silicon floats on the molten liquid surface in the whole area outside the partition ring 11 so as to be molten in this whole area. If the feeder 13 is immersed in the molten liquid, the melting region of granular silicon is limited to the inside of the feeding pipe. Therefore, heat transfer from the molten liquid to granular silicon becomes insufficient, causing it to be impossible to melt the granular silicon continuously.

In the present invention described above, when the partition ring 11 is exposed excessively above the molten liquid surface, solidification of the molten liquid will occur at this part due to big heat radiation effect. Accordingly, the exposure is required to meet the above-mentioned conditions, and the height of the exposed portion has been set within 5 mm in the embodiment.

Figure 10:
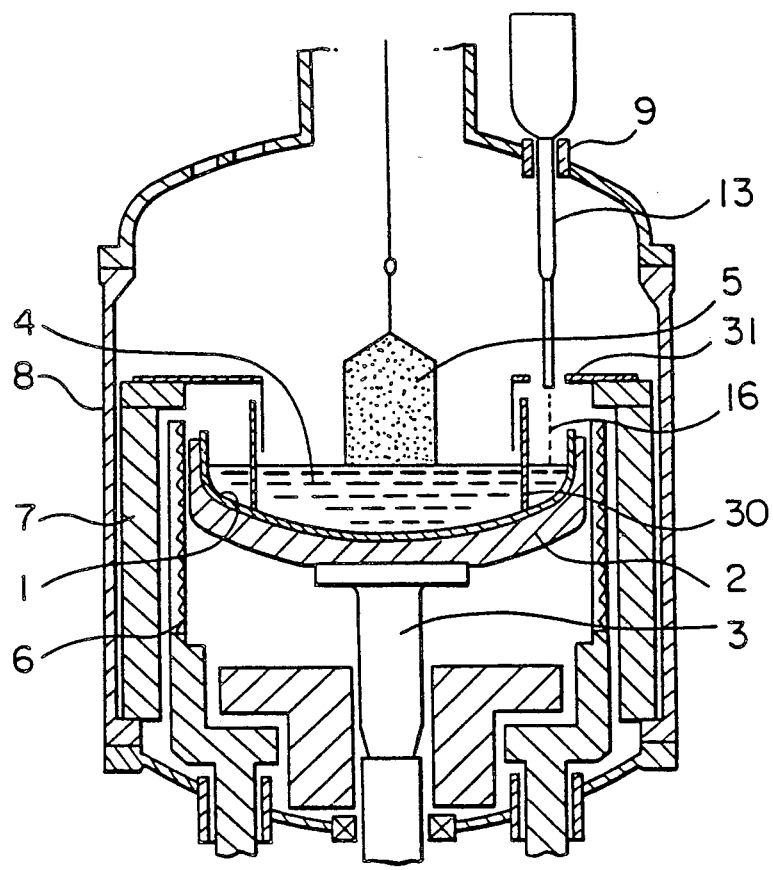
FIG. 10 is a longitudinal cross-sectional view showing another embodiment according to the present invention.
Figure 11:
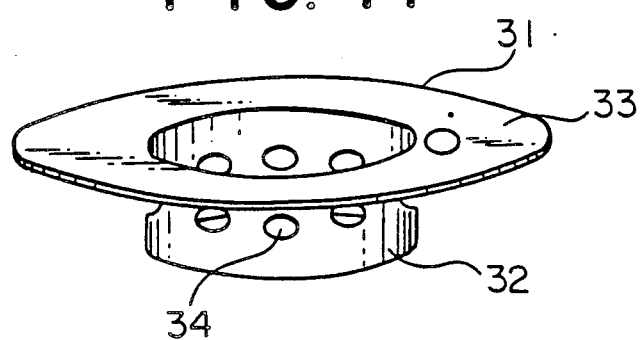
FIG. 11 is a view showing another embodiment of a heat keeping board.
Figure 11:
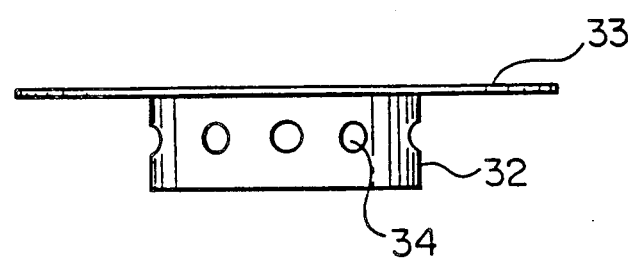

The height of exposed portion of the partition 11, however, should be made higher than the above value in spite of the deteriorative effect of solidification, when the granular silicon is fed without speed reduction or large diameter crystal is grown at high pulling rate. The granular silicon which drops with high speed hits the surface of molten silicon very strongly, making many splashes of molten silicon. The splashes often jump beyond the partition 11 and disturb crystal growth. In high speed crystal growth where crystal 5 is pulled at a rate higher than 0.7 mm/min, granular silicon is fed at a greater rate. The greater feed rate frequently causes the granular silicon to jump beyond the partition 11. From the jump resulted is such a phenomenon that granular silicon drops on, and is repulsed by, other granular silicon floating on the surface of molten silicon. Therefore, the more the feed rate of the raw materials increases, the more the rat of jumps increase. This jump of granular silicon also disturbs the crystal growth. In this case, the height of 5 mm of the exposed portion of partition is insufficient to prevent the granular silicon from splashing and jumping into the crystal pulling area. As shown FIG. 10, the partition 30 is required to be exposed above molten silicon surface by a height larger than 3 cm to prevent the jumping. The maximum of the exposed height is 40 cm. The crystal pulling apparatus in the present invention cannot be equipped with a partition having an exposed height larger than 40 cm, because the partition 30 is obstructed by the heat keeping board 31. As the partition is high as mentioned above, the shape of heat keeping board becomes as shown in FIG. 11, in order to be more effective in suppressing heat radiation from the partition 30. That is, the heat keeping board 31 is composed of the cylindrical portion 32 and the flange portion 33. Heat radiation from the partition 30 is mainly suppressed by the cylindrical portion 32. Appropriate distance between the cylindrical portion 32 and the surface of molten silicon is from 5 mm to 60 mm. A distance larger than 5 mm is recommended for perfectly preventing the bottom edge of the cylindrical portion 32 from touching the surface of molten silicon. The upper limit 60 mm is determined from the view point of heat keeping effect. The heat keeping effect decreases with increase of the distance between the cylindrical portion 332 and the surface of molten silicon. Required heat keeping effect cannot be obtained for the distance larger than 60 mm. As materials for the cylindrical portion 32, metal is most suitable because of its low emissibility and surface cleanliness. Molybdenum and tantalum are used, as they have high strength at high temperature and good formability. A good heat keeping effect of the metal results from its low emissibility. Sometimes windows 34 are made on the cylindrical portion 32 in order to adjust the thermal circumstances for the crystal 5 (FIG. 11).

Furthermore, the diameter of small holes 12 provided on the partition ring 11 is set within 5 mm. This size should be small enough for the liquid in the crystal growing area not to flow back into the raw materials melting area. The minimum diameter of the holes is 1 mm, because it is difficult to make holes having a diameter smaller than this size. It is desired that the number of holes is more than one so that fluctuation of liquid temperature in the crystal pulling area is as small as possible. If a localized hotter flow of silicon liquid comes in from a single hole, it will cause a large temperature fluctuation in the silicon melt. This is unfavorable for growing a single crystal with a large diameter. The position of the holes in the depth direction is also selected in the area lower than the central part of the immersed portion as described previously so as to be kept away from the solidification front of the single silicon crystal 5. Besides, it is desirable that the diameter of the partition ring 11, 30 is twice or more of the diameter of the pulled single silicon crystal 5.

Furthermore, as the result of an experiment, it has been found that the temperature of the molten liquid surface outside the partition ring 11, 30 has to be higher than the temperature of the molten liquid surface inside it by at least 10° C., preferably 20° C., in order to pull a sound single silicon crystal 5 while melting the granular silicon 16 which is fed continuously. In order to get this temperature difference, the heat radiation from the molten liquid surface outside the partition ring 11, 30 is depressed by the heat keeping board 20,30. The temperatures of both molten liquid surfaces are detected by temperature detectors 14 and 15, which ensures to keep the temperature difference.

The maximum temperature difference obtainable by this invention is estimated to be 100° according to heat transfer calculations Any higher temperature of silicon liquid outside the partition results in a larger temperature fluctuation in crystal pulling area and in acceleration of erosion of the quartz crucible and the partition by liquid silicon. Therefore, the temperature difference is desired to be less than 100° C. from a practical viewpoint as well as the above calculation.

Figure 4:
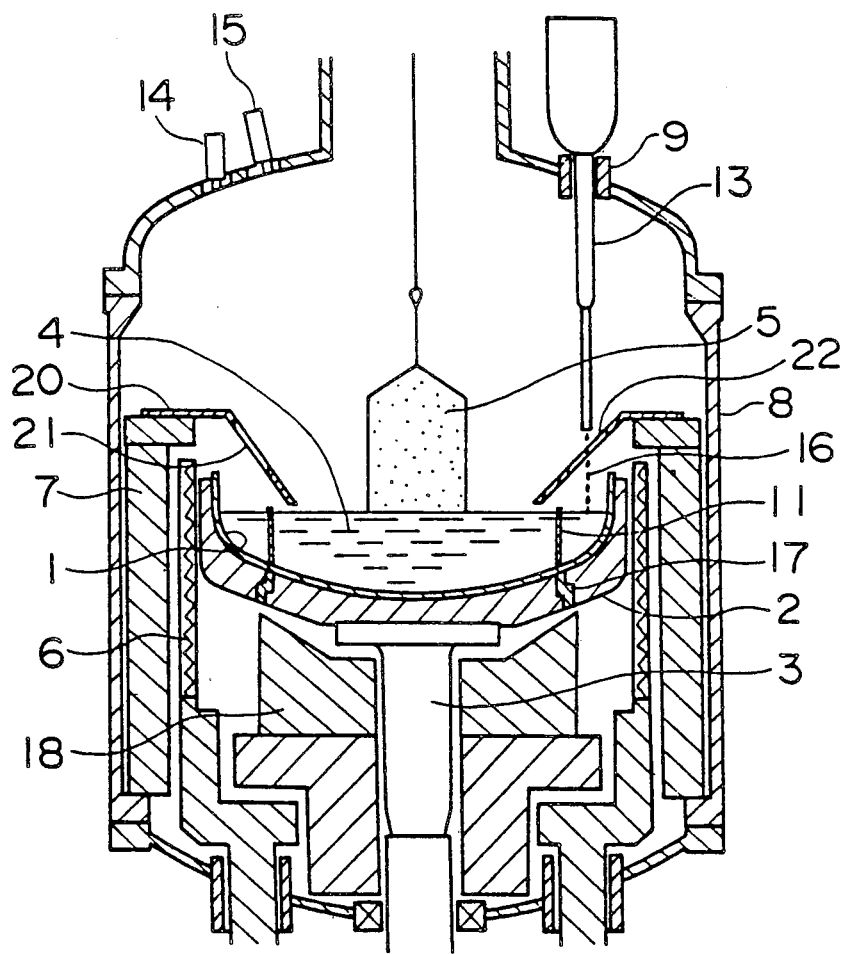
FIG. 4 and FIG. 5 are longitudinal cross-sectional views showing typically another embodiment of the invention.

FIG. 4 is a longitudinal cross-sectional view showing typically another embodiment of the invention. In this embodiment, in order to maintain the temperature of molten liquid surfaces inside and outside the above-mentioned partition ring 11 more surely, heat resisting materials 17 of high purity having low thermal conductivity, such as $Si_3N_4$, are disposed at locations of the graphite crucible 2 above which the partition ring 11 is set in the crucible, thereby intercepting thermal conduction from the outer periphery of the graphite crucible 2 adjacent to the heater 6 to the inside thereof.

Also, in order to reduce heat inflow from the bottom portion of the graphite crucible 2, there is provided, for example, a shielding block made of graphite underneath the graphite crucible 2 so as to reduce direct heat from the heater 6. Besides, if the heat insulating block 8 is made hollow and a carbon heater, for example, is provided inside thereof, the temperature at the bottom portion of the graphite crucible may be controlled more minutely.

By means of this embodiment thus constructed, it is possible to control the temperature of the molten liquid surfaces inside and outside the partition ring 11 more surely, thereby maintaining the desired temperature difference.

Figure 5:
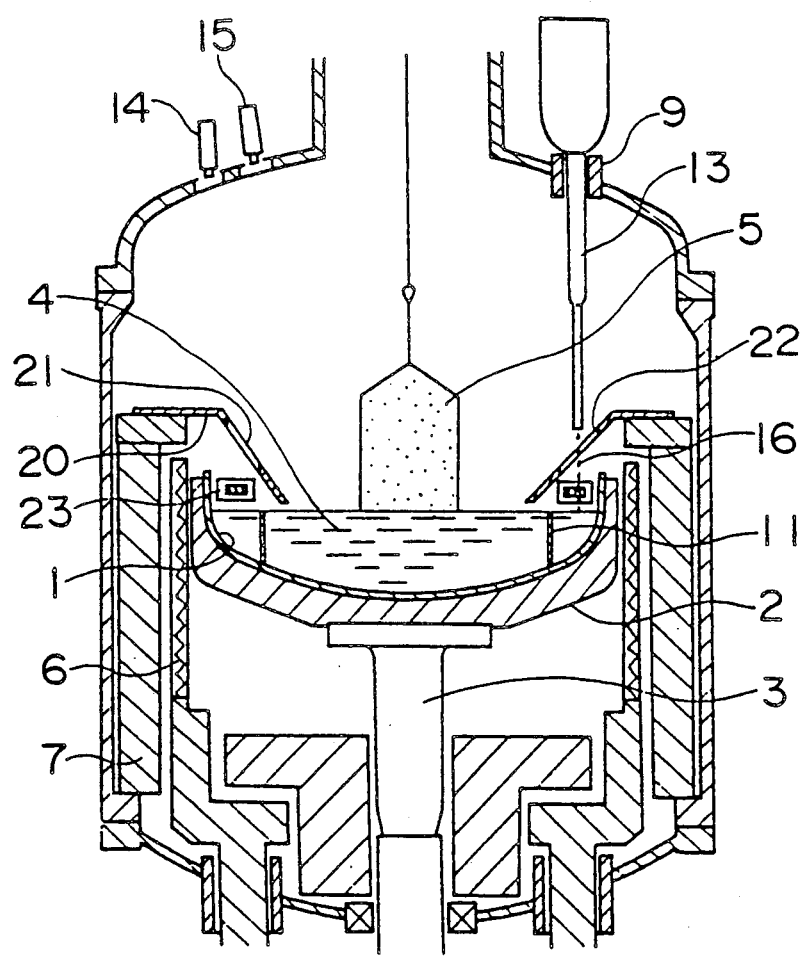
Figure 6:
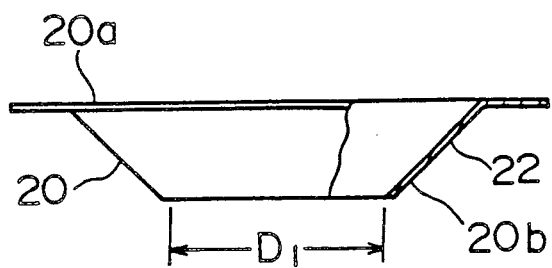
FIG. 6 is a side view showing an embodiment of a heat keeping board.
Figure 7:
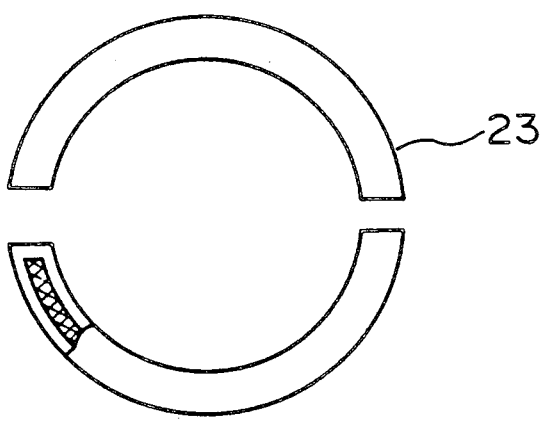
FIG. 7 is a plan view showing an embodiment of an auxiliary heater.

FIG. 5 is a longitudinal cross-sectional view showing typically still another embodiment of the invention. In the Figure, a reference numeral 23 denotes an auxiliary heater having a ring form in general, which is disposed not in the area just under the raw materials feeder 13 and the visual field areas of temperature detectors 14 and 15 as shown in FIG. 7. This auxiliary heater 23 consists of a carbon heating element for instance, and is surrounded by quartz of high purity so as to prevent the single silicon crystal 5 from contamination with impurity.

According to the present invention, the auxiliary heater 23 is disposed on the molten liquid surface outside the partition ring 11 and the inner periphery thereof is surrounded with the heat keeping board 20. Therefore, the temperature of the molten liquid surfaces inside and outside the partition ring 11 may not only be maintained at a desired value, but also may be controlled by the measurement of temperature detectors 14 and 15.

Figure 8:
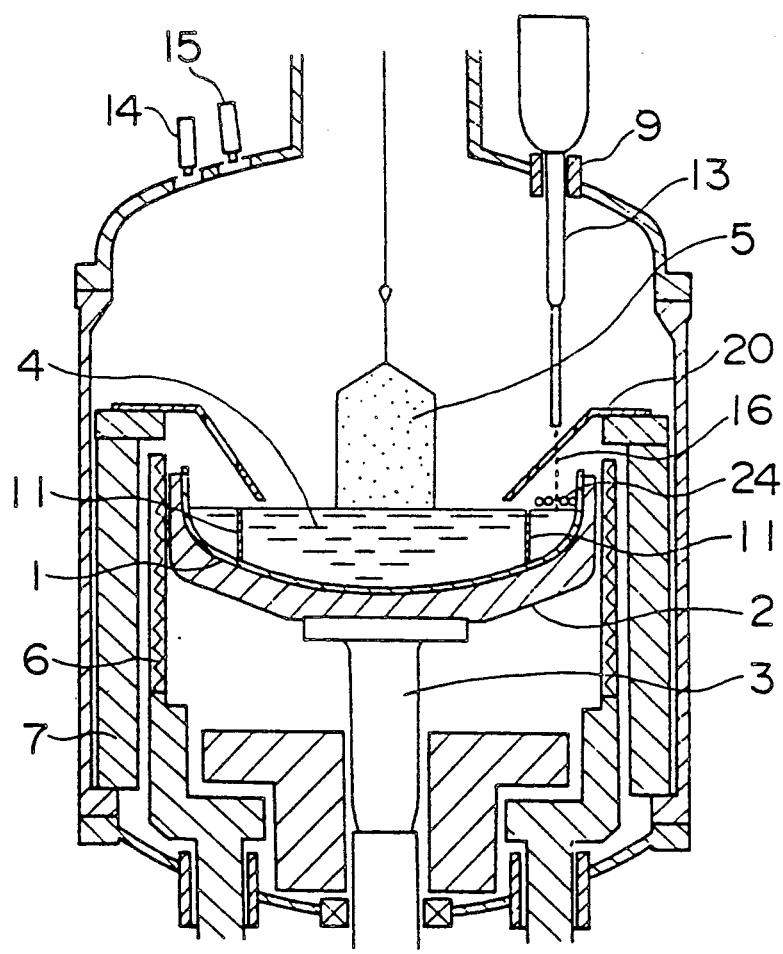
FIG. 8 is a longitudinal cross-sectional view showing typically another embodiment according to the present invention.
Figure 9:
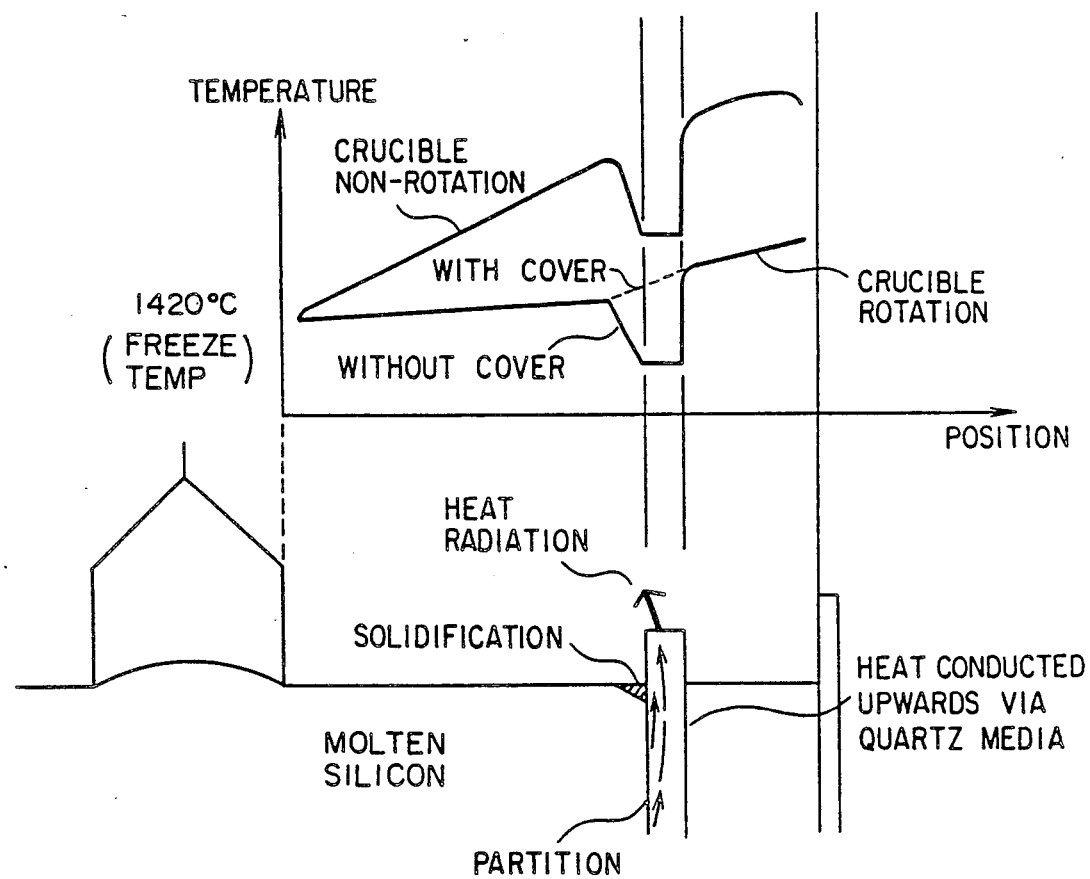
FIG. 9 is a schematic representation of temperature distribution on the surface of silicon liquid.

FIG. 8 shows another embodiment of the above-mentioned invention, wherein a high frequency induction heating system is adopted as the auxiliary heater. In this embodiment, a plurality of induction coils 24 formed in a spiral are disposed on the molten liquid surface outside the partition ring 11 and high frequency current (100 KHz in the embodiment) is applied to these induction coils 24, thereby heating directly the molten liquid surface. In this case, granular silicon 16 is fed from the raw materials feeder 3 through the gap at the central portion of induction coils 24. Besides, a case in which a plurality of small-sized induction coils 24 are disposed on the molten liquid surface has been described in the above-mentioned embodiment, but one piece of induction coils in a spiral form corresponding to the size of the raw materials melting area outside the partition ring 11 may be disposed instead.

In each of the embodiments described above, a case wherein one set of feeders 13 for feeding granular silicon 16 onto the molten liquid surface outside the partition ring 11 has described, but 2 sets or more of feeders may be provided.

Also, each embodiment may be executed independently or in appropriate combination of embodiments.

The fed silicon raw materials 16 contains a doping material in the quantity which is equal to that in the pulled single crystal 5, of which explanation has been omitted in the method of pulling a single silicon crystal because the process is executed necessarily. Practically this doping is carried out by mixing pure silicon granule which is raw materials and highly doped piece of silicon. Also, it has been confirmed that the present invention may be executed perfectly even when a magnetic field is applied to the molten liquid from the outside of the chamber 8.

As is apparent from the foregoing, the present invention is constructed in such a manner that granular silicon is fed to the outside molten liquid surface while preventing the wave pattern from propagating to the inside of the partition ring by dividing the crucible inside and outside with a partition ring and covering the partition ring and the wall surface of the crucible with a heat keeping board, the fed raw material is molten and moved inside so as to maintain the liquid surface of the molten raw materials at a constant level, and the temperature of the outside molten surface is higher than the temperature of the inside molten surface, thus enabling to pull a sound single silicon crystal. As the result, improvement of the yield and improvement of productivity may be realized by uniformalizing the quality in the pulling direction, which is very effectual in execution.

What is claimed is:

1. An apparatus for manufacturing columnar single silicon crystals having a diameter of 12 cm-30 cm having a rotating crucible and heating by an electrical resistance heater surrounding the side wall of said crucible which comprises:
   (a) a cylindrical partition means made of fused quartz separating the crucible into two areas, a raw materials melting area and a crystal pulling area, said partition fixed to the bottom of the crucible, the top thereof being arranged as projecting above the surface of the molten liquid and having a plurality of small holes through which molten silicon can flow only in one direction from the raw materials melting area to the crystal pulling area;
   (b) means for introducing granular silicon or chunks of silicon, into said raw materials melting area; and
   (c) a heat keeping board consisting of a disk-like member having a round opening at its center and a hole for introducing said granular silicon or chunk of silicon and a cylindrical or funnel-shaped member connected to the inner periphery of said opening extending downward vertically or slopewise toward the center, covering only the surface of the molten liquid in the raw materials melting area and the top and the inner side of the partition projecting above the surface of molten liquid.

2. An apparatus according to claim 1 wherein the top portion of said partition means is exposed above the surface of molten silicon by about 5 mm and wherein said heat keeping board contains a flange portion and a funnel-shaped shielding portion.

3. An apparatus according to claim 1 including a cylindrical partition, the top edge of which is exposed above the surface of molten silicon by 3 cm-40 cm in height, a heat keeping board consisting of cylindrical portion covering the inner wall of said partition and a flange portion covering the top edge of said partition as well as said raw materials melting area, the distance between the bottom edge of said cylindrical portion of heat keeping board and the surface of the molten silicon being 5 mm-60 mm.

4. An apparatus according to claim 1 wherein said flange portion of said heat keeping board is made of graphite.

5. An apparatus according to claim 1 wherein said shielding portion of said heat keeping portion is made of a metal.

6. An apparatus according to claim 1 wherein the diameter of holes on said partition means is below 5 mm and the number of holes is within the range from 2 to 34.

7. An apparatus according to claim 2 wherein said flange portion of said heat keeping board is made of graphite.

8. An apparatus according to claim 3 wherein said flange portion of said heat keeping board is made of graphite.

9. An apparatus according to claim 2 wherein said shielding portion of said heat keeping portion is made of a metal.

10. An apparatus according to claim 3 wherein said shielding portion of said heat keeping portion is made of a metal.

11. An apparatus according to claim 2 wherein the diameter of holes on said partition means is below 5 mm and the number of holes is within the range from 2 to 34.

12. An apparatus according to claim 3 wherein the diameter of holes on said partition means is below 5 mm and the number of holes is within the range from 2 to 34.

* * * * *